(12) United States Patent
Liao et al.

(10) Patent No.: US 11,362,049 B2
(45) Date of Patent: Jun. 14, 2022

(54) SEMICONDUCTOR DEVICE PACKAGE

(71) Applicant: Advanced Semiconductor Engineering, Inc., Kaohsiung (TW)

(72) Inventors: Guo-Cheng Liao, Kaohsiung (TW); Yi Chuan Ding, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 85 days.

(21) Appl. No.: 16/732,163

(22) Filed: Dec. 31, 2019

(65) Prior Publication Data

US 2021/0202410 A1 Jul. 1, 2021

(51) Int. Cl.
*H01L 23/66* (2006.01)
*H01L 23/528* (2006.01)
*H01L 23/00* (2006.01)

(52) U.S. Cl.
CPC .......... *H01L 23/66* (2013.01); *H01L 23/5286* (2013.01); *H01L 24/13* (2013.01); *H01L 24/29* (2013.01); *H01L 2223/6677* (2013.01)

(58) Field of Classification Search
CPC ............. H01L 23/66; H01L 2223/6677; H01L 23/5286
See application file for complete search history.

(56) References Cited

U.S. PATENT DOCUMENTS 6,034,643 A * 3/2000 Nishikawa ............... H01Q 3/08
343/765
2018/0205155 A1 7/2018 Mizunuma et al.
2020/0388928 A1* 12/2020 Lin ......................... H01L 23/13

* cited by examiner

*Primary Examiner* — Dale E Page
*Assistant Examiner* — Wilner Jean Baptiste
(74) *Attorney, Agent, or Firm* — Foley & Lardner LLP

(57) ABSTRACT

A semiconductor device package includes a first surface and a second surface opposite to the first surface. The semiconductor device package further includes a first supporting structure disposed on the first surface of the substrate and a second supporting structure disposed on the first surface of the substrate. The first supporting structure has a first surface spaced apart from the first surface of the substrate by a first distance. The second supporting structure has a first surface spaced apart from the first surface of the substrate by a second distance. The second distance is different from the first distance. The semiconductor device package further includes a first antenna disposed above the first surface of the substrate. The first antenna is supported by the first surface of the first supporting structure and the first surface of the second supporting structure.

19 Claims, 8 Drawing Sheets

SEMICONDUCTOR DEVICE PACKAGE

BACKGROUND

1. Technical Field

The present disclosure generally relates to a semiconductor device package, and to a semiconductor device package including an antenna.

2. Description of the Related Art

Wireless communication devices such as mobile phones may include semiconductor device package(s) having antennas for signal (e.g. radio frequency (RF) signals) transmission, such as Antenna on Package (AoP). Patch antennas are more commonly used than other antennas because of their directivity, ease of fabrication, and also because they are compact and lightweight. As the operating frequency increases (e.g. equal to or greater than 5 GHz), signal attenuation or signal loss of the RF signal may worsen.

SUMMARY

In one or more embodiments, a semiconductor device package includes a substrate having a first surface and a second surface opposite to the first surface. The semiconductor device package further includes a first supporting structure disposed on the first surface of the substrate and a second supporting structure disposed on the first surface of the substrate. The first supporting structure has a first surface spaced apart from the first surface of the substrate by a first distance. The second supporting structure has a first surface spaced apart from the first surface of the substrate by a second distance. The second distance is different from the first distance. The semiconductor device package further includes a first antenna disposed above the first surface of the substrate. The first antenna is supported by the first surface of the first supporting structure and the first surface of the second supporting structure.

In one or more embodiments, a semiconductor device package includes a substrate having a first surface and a second surface opposite to the first surface. The semiconductor device package further includes an antenna disposed above the first surface of the substrate. A prolonged line of the antenna and a prolonged line of the first surface of the substrate define an acute angle. The semiconductor device package further includes a grounding element disposed between the antenna and the substrate. The grounding element is parallel to the antenna.

In one or more embodiments, a semiconductor device package includes a substrate having a first surface and a second surface opposite to the first surface. The semiconductor device package further includes a first supporting structure disposed on the first surface of the substrate. The first supporting structure has a first top surface parallel to the first surface of the substrate and a second top surface parallel to the first surface of the substrate. A distance between the first top surface of the first supporting structure and the first surface of the substrate is different from a distance between the second top surface of the first supporting structure and the first surface of the substrate. The semiconductor device package further includes a first antenna disposed on the first top surface of the first supporting structure. The semiconductor device package further includes a second antenna disposed on the second top surface of the first supporting structure.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
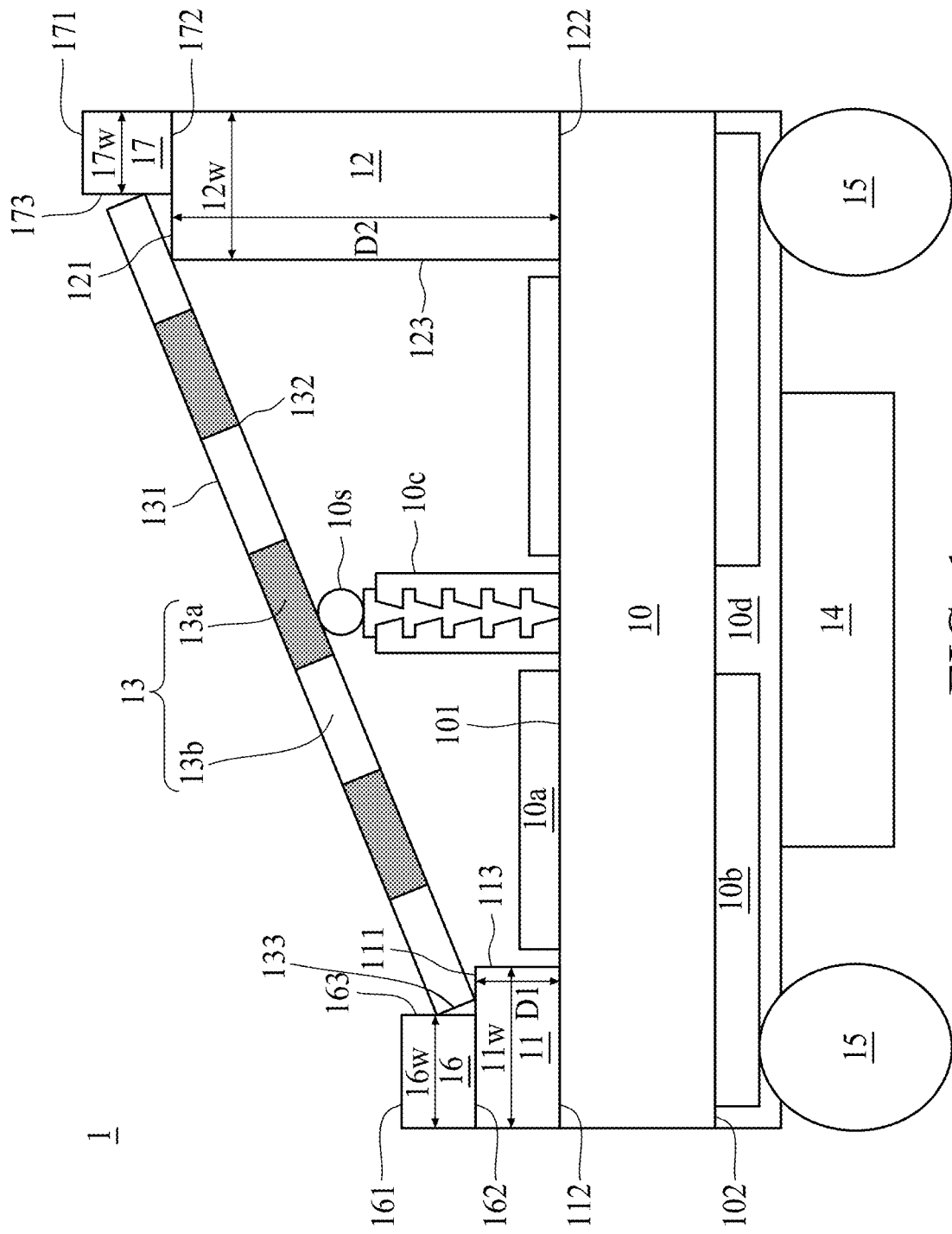
FIG. 1 illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a semiconductor device package 1 in accordance with some embodiments of the present disclosure. The semiconductor device package 1 includes a substrate 10, supporting structures 11, 12, 16, and 17 on the substrate 10, an antenna 13, an electronic component 14, and electrical contacts 15.

The substrate 10 has a surface 101 and a surface 102 opposite the surface 101. The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL).

The substrate 10 includes conductive layers 10a and 10b respectively on the surface 101 and the surface 102. The conductive layer 10b is covered by a dielectric layer 10d disposed on the surface 102. In some embodiments, the conductive layer 10a is a grounding layer.

The supporting structure 11 is disposed on the surface 101 of the substrate 10. The supporting structure 11 has a surface 112 facing the surface 101 of the substrate 10, a surface 111 facing away from the surface 101 of the substrate 10, and a surface (or a sidewall) 113 extending between the surface 112 and the surface 111.

Figure 5:
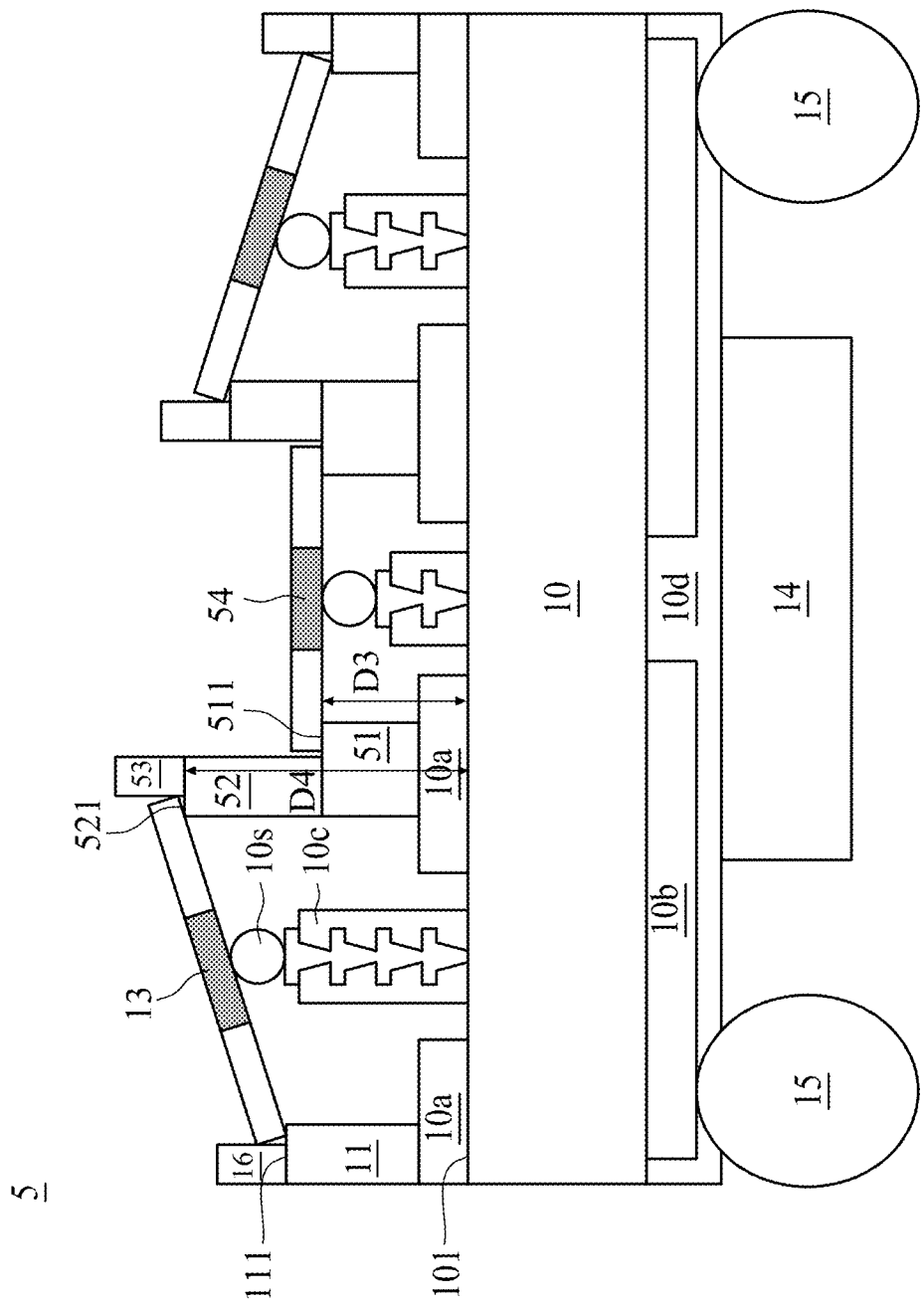
FIG. 5 illustrates a cross-sectional view of a semiconductor device package in accordance with some embodiments of the present disclosure.

The surface 112 is in contact with the surface 101 of the substrate 10, as illustrated in FIG. 1. In some embodiments, the surface 112 may be in contact with the conductive layer 10a (or the grounding layer) provided on the surface 101 of the substrate 10, as illustrated in FIG. 5.

The surface 111 is spaced apart from the surface 101 of the substrate 10 by a distance D1.

The supporting structure 16 is disposed on the surface 111 of the supporting structure 11. The supporting structure 16 has a surface 162 in contact with the surface 111, a surface 161 opposite the surface 162, and a surface (or a sidewall) 163 extending between the surface 162 and the surface 161.

A width 11w of the supporting structure 11 is greater than a width 16w of the supporting structure 16. In some embodiments, the width of the supporting structures (such as the widths 11w and 16w) can be measured along a direction substantially parallel to the surface 101 of the substrate 10.

The surface 163, the surface 111, and the surface 113 define a stepped structure.

In some embodiments, an interface between the supporting structures 11 and 16 can be observed.

Similar to the supporting structures 11 and 16, the supporting structure 12 is disposed on the surface 101 of the substrate 10. The supporting structure 12 has a surface 122, a surface 121, and a surface (or a sidewall) 123 extending between the surface 122 and the surface 121.

The surface 121 is spaced apart from the surface 101 of the substrate 10 by a distance D2. The surface 111 and the surface 121 may have different elevations with respect to the surface 101 of the substrate 10. For example, the distance D1 and the distance D2 are different. For example, as shown in FIG. 1, the distance D1 is smaller than the distance D2. In some embodiments, the distance D1 may be greater than the distance D2.

The supporting structure 17 is disposed on the surface 121 of the supporting structure 12. The supporting structure 17 has a surface 172, a surface 171 opposite the surface 172, and a surface (or a sidewall) 173 extending between the surface 172 and the surface 171.

A width 12w of the supporting structure 12 is greater than a width 17w of the supporting structure 17.

The surface 173, the surface 121, and the surface 123 define a stepped structure.

In some embodiments, each of the supporting structures 11, 12, 16, and 17 may include insulation materials. In some embodiments, each of the supporting structures 11, 12, 16, and 17 may include photo sensitive materials, such as photo-imageable dielectric (PID).

As shown in FIG. 1, the supporting structures 11, 12, 16, and 17 provide surfaces having different heights, elevations or distances (such as the distances D1 and D2 denoted in FIG. 1) measured from the substrate 10, such that the antenna 13 supported by the aforesaid surfaces can be positioned in a sloping or slanting manner with respect to the substrate 10. As such, multiple orientations of the antenna can be achieved to allow for more optimal and flexible RF coverage.

In some embodiments, each of the supporting structures 11, 12, 16, and 17 may include a dielectric material. For example, each of the supporting structures 11, 12, 16, and 17 may include molding compounds, pre-impregnated composite fibers (e.g., pre-preg), Borophosphosilicate Glass (BPSG), silicon oxide, silicon nitride, silicon oxynitride, Undoped Silicate Glass (USG), any combination thereof, or the like. Examples of molding compounds may include but are not limited to, an epoxy resin including fillers dispersed therein. Examples of a pre-preg may include but are not limited to, a multi-layer structure formed by stacking or laminating a number of pre-impregnated materials/sheets.

Figure 3:
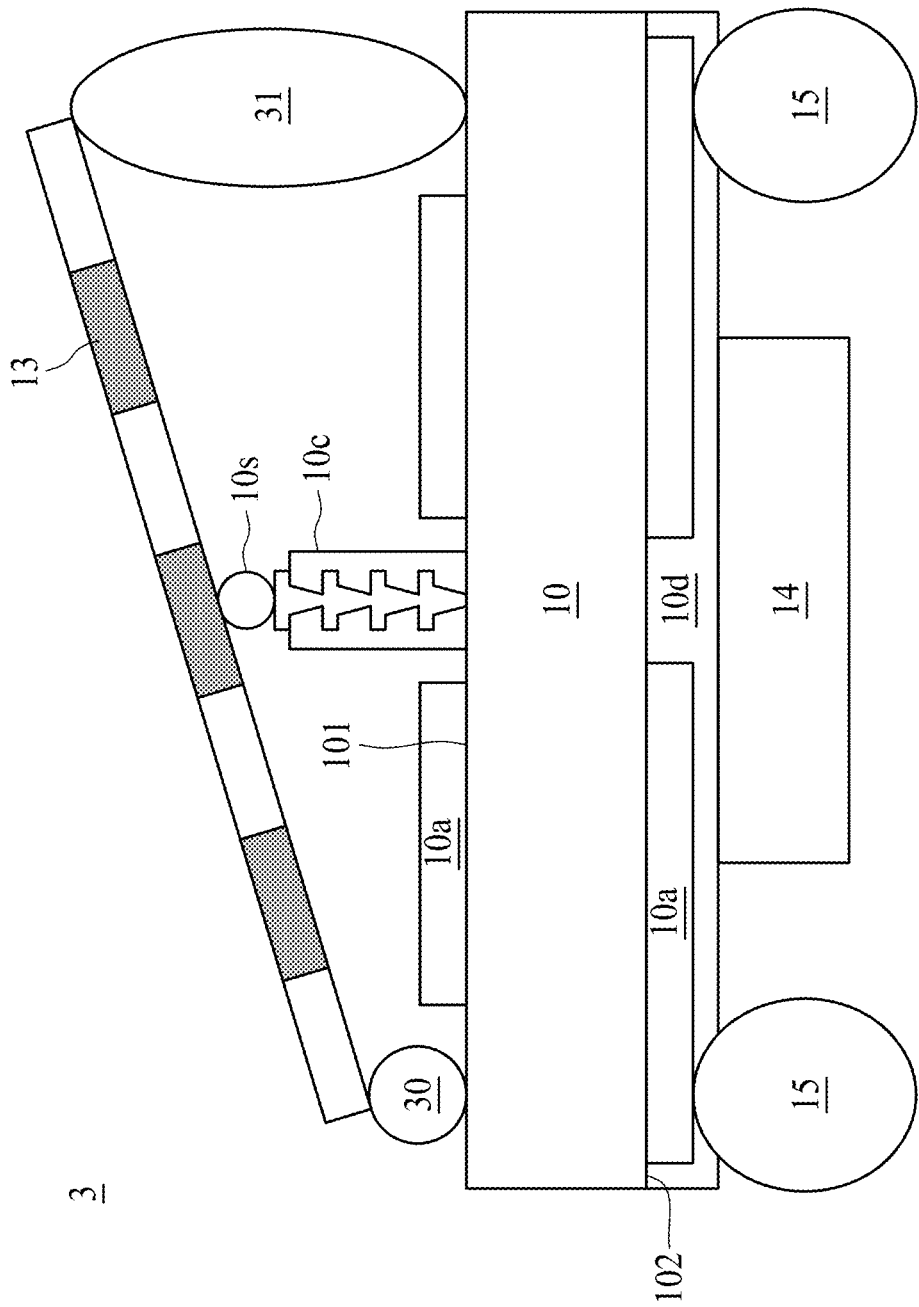
FIG. 3 illustrates a cross-sectional view of a semiconductor device package in accordance with some embodiments of the present disclosure.

In some embodiments, each of the supporting structures 11, 12, 16, and 17 may include a solder ball (such as shown in FIG. 3), a liquid crystal polymer, a pillar (such as a copper pillar), a conducting resin, or a combination thereof.

The antenna 13 is disposed above the surface 101 of the substrate 10 and supported by the supporting structures 11 and 12. The antenna 13 has a surface 131 facing away from the surface 101, a surface 132 facing the surface 101, and a lateral surface 133 extending between the surface 131 and the surface 132.

In some embodiments, the surface 131 and the surface 132 of the antenna 13 are exposed. In some embodiments, the surface 131 and the surface 132 of the antenna 13 are uncovered. In some embodiments, the surface 131 and the surface 132 of the antenna 13 are exposed to air. In some embodiments, the surface 131 and the surface 132 of the antenna 13 are in direct contact to air. In some embodiments, the semiconductor device package 1 is disposed within a vacuum space or a vacuum cavity and thus the surface 131 and the surface 132 of the antenna 13 are exposed to vacuum.

Experiment results show that the antenna having surfaces exposed to air (or a vacuum, with a dissipation constant (Dk) of approximately 1) can have a peak gain about 1.3 to about 2.3 times that of the other antenna having surfaces covered by the dielectric material with a Dk of approximately 4.

The antenna 13 is not parallel to the surface 101 of the substrate 10. For example, the surface 131 of the antenna 13 and the surface 111 of the supporting structure 11 define an acute angle. For example, a prolonged line of the surface 131 of the antenna 13 and a prolonged line of the surface 101 of the substrate 10 define an acute angle. For example, a normal vector of the surface 131 of the antenna 13 and a normal vector of the surface 101 of the substrate 10 define an acute angle.

In some embodiments, the lateral surface 133 of the antenna 13 may be spaced apart from the surface 163 of the supporting structure 16. In some embodiments, an adhesive layer (not illustrated in the figures) may be disposed between the lateral surface 133 of the antenna 13 and the supporting structures. For example, an adhesive layer may be disposed between the lateral surface 133 of the antenna 13 and the surface 163 of the supporting structure 16. For example, an adhesive layer may be disposed between the lateral surface 133 of the antenna 13 and the surface 111 of the supporting structure 11.

In some embodiments, the adhesive layer may include a gel-type adhesive layer, a film type adhesive layer, or the other suitable type of adhesive layer or the combination thereof. In some embodiments, the adhesive layer may include a thermoset resin, a thermoplastic resin, a polyester resin, a polyether resin, an epoxy resin a polyolefin composition, or the other suitable material or the combination thereof.

In some embodiments, the antenna 13 may include a conductive material such as a metal or metal alloy. Examples of the conductive material include gold (Au), silver (Ag), aluminum (Al), copper (Cu), or an alloy thereof. In some embodiments, the antenna 13 may include a patch antenna. In some embodiments, the antenna 13 may include an antenna pattern 13a and a protection layer 13b surrounding the antenna pattern 13a. For example, a lateral surface of the antenna pattern 13a can be covered or in contact with the protection layer 13b. The antenna pattern 13a can be embedded within the protection layer 13b, wherein both surfaces of the antenna pattern 13a are uncovered by the protection layer 13b.

The antenna 13 is electrically connected to the substrate 10 (such as the interconnection structure of the substrate 10) through, for example but is not limited to, conducting elements 10c and 10s. In some embodiments, the conducting element 10c may function as a feeding element to provide a signal to the antenna 13. In some embodiments, the conducting element 10c may include, but not limited to, a metal pillar, a bonding wire or stacked vias. In some embodiments, the conducting element 10c may include Au, Ag, Al, Cu, or an alloy thereof. In some embodiments, the connection element 10s may include, but is not limited to, a solder ball or any other suitable electrical connection structures.

The electronic component 14 is provided the surface 102 of the substrate 10. The electronic component 14 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof.

The electrical contact 15 (e.g. a solder ball) is disposed on the conductive layer 10b and can provide electrical connections between the semiconductor package device 1 and external components (e.g. external circuits or circuit boards). In some embodiments, the electrical contact 15 includes a controlled collapse chip connection (C4) bump, a ball grid array (BGA) or a land grid array (LGA).

Figure 2:
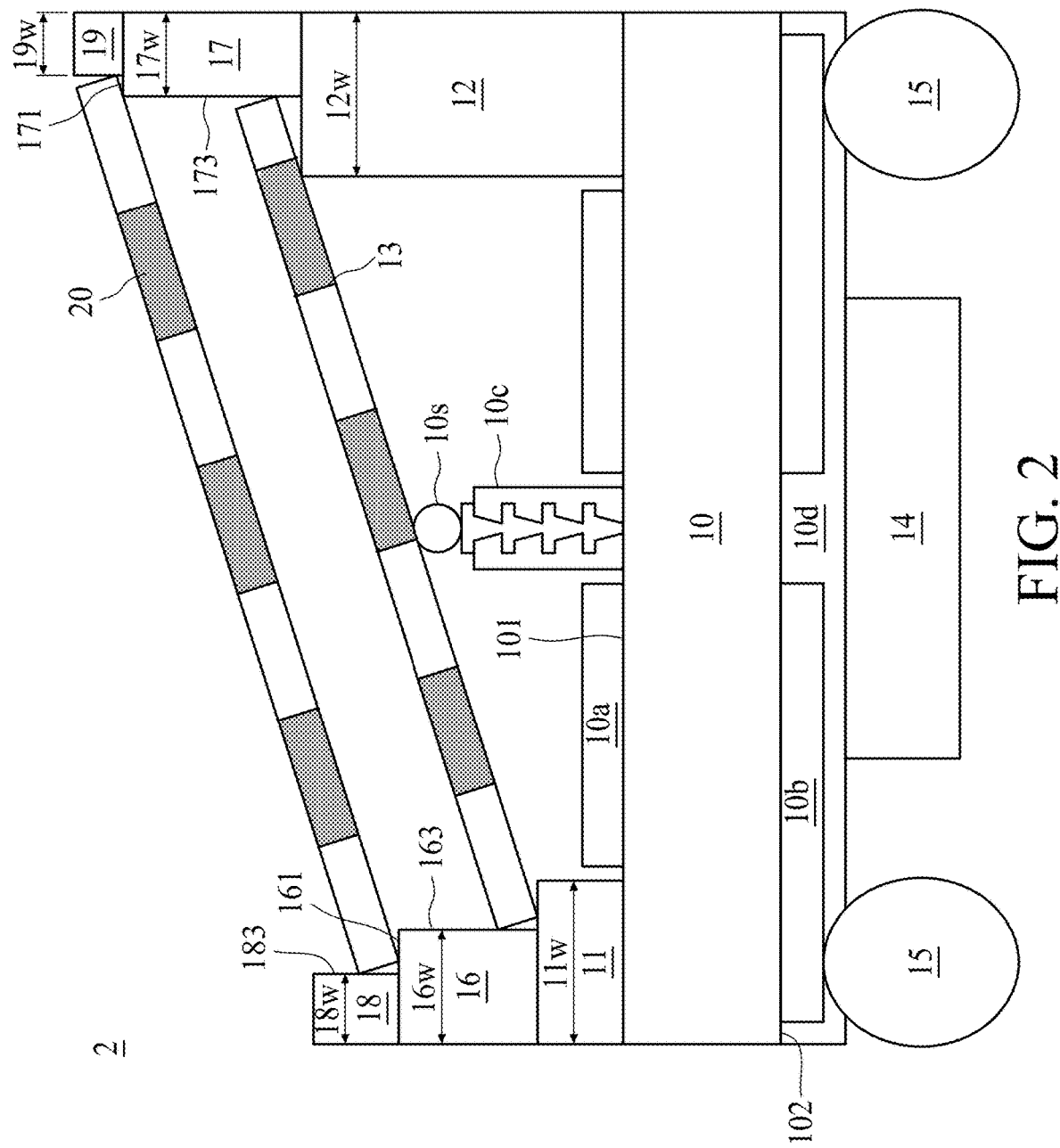
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 of FIG. 2 is similar to the semiconductor device package 1 of FIG. 1, and the differences therebetween are described below.

The semiconductor device package 2 further includes supporting structures 18 and 19, and another antenna 20 disposed above the antenna 13.

The supporting structure 18 is disposed on the supporting structure 16. The width 18w of the supporting structure 18 is smaller than the width 16w of the supporting structure 16. A surface 183 of the supporting structure 18, the surface 161 and the surface 163 of the supporting structure 16 define a stepped structure.

Similar to the supporting structure 18, the supporting structure 19 is disposed on the supporting structure 17, and has the width 19w smaller than the width 17w of the supporting structure 17.

The surface 161 and the surface 171 may have different elevations with respect to the surface 101 of the substrate 10. For example, the distance between the surface 161 and the surface 101 is different from the distance between the surface 171 and the surface 101. For example, as shown in FIG. 2, the distance between the surface 171 and the surface 101 is greater than the distance between the surface 161 and the surface 101.

The antenna 20 is disposed above the antenna 13 and supported by the supporting structures 16 and 17. In some embodiments, the antenna 20 is parallel to the antenna 13.

In some embodiments, an antenna pattern of the antenna 20 may be aligned with an antenna pattern of the antenna 13. For example, the antenna pattern of the antenna 20 may be aligned with the antenna pattern of the antenna 13 in a direction perpendicular to a surface (such as the surface 131 in FIG. 1) of the antenna 13.

In the embodiments, signals can be transmitted between the antenna 13 and the antenna 20 through coupling.

Although there are four supporting structures and six supporting structures depicted in FIG. 1 and FIG. 2, respectively, the number of the supporting structures is not limited thereto. In some embodiments, the number of the supporting structures can be changed depending on design specifications.

FIG. 3 illustrates a cross-sectional view of a semiconductor device package 3 in accordance with some embodiments of the present disclosure. The semiconductor device package 3 of FIG. 3 is similar to the semiconductor device package 1 of FIG. 1, and the differences therebetween are described below.

In FIG. 3, the supporting structures 11, 12, 16, and 17 in FIG. 1 are replaced by solder balls 30 and 31.

The solder balls 30 and 31 are disposed on the surface 101. The solder balls 30 and 31 have different heights. For example, the distance between the topmost point of the solder ball 30 and the surface 101 is different from the distance between the topmost point of the solder ball 31 and the surface 101.

Figure 4:
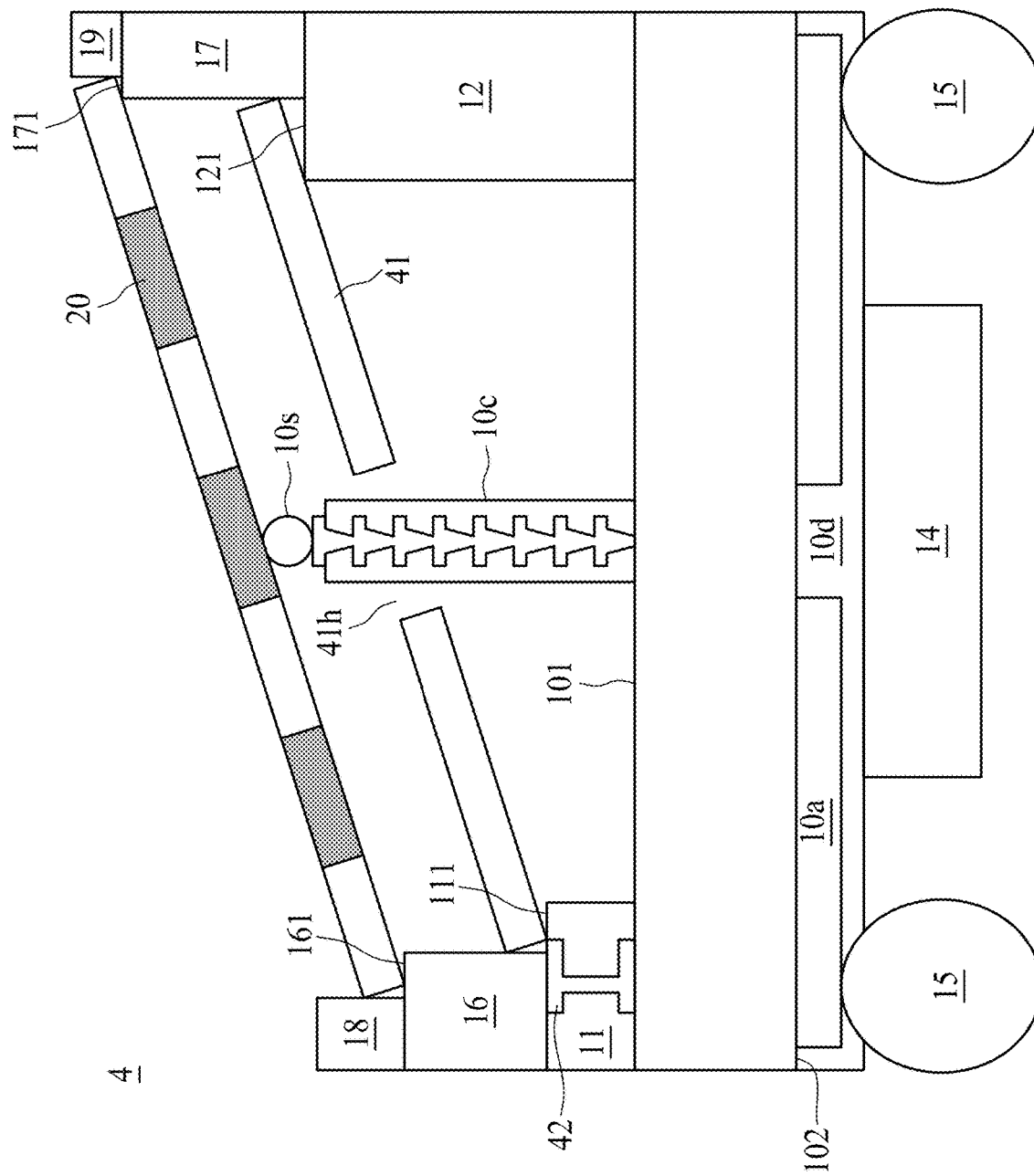
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 of FIG. 4 is similar to the semiconductor device package 2 of FIG. 2, and the differences therebetween are described below.

In FIG. 4, the semiconductor device package 4 includes the antenna 20 and a grounding element 41 disposed above the surface 101 of the substrate 10 and supported by the supporting structures. The grounding element 41 is spaced apart from the surface 101 of the substrate 10. In some embodiments, the grounding element 41 is parallel to the antenna 20.

The grounding element 41 includes a hole 41h. The conducting element 10c passes through the hole 41h of the grounding element 41 and connects to the antenna 20.

The grounding element 41 is electrically connected to the substrate 10 (such as the interconnection structure of the substrate 10) through a conductive via 42 disposed within the supporting structure 11.

FIG. 5 illustrates a cross-sectional view of a semiconductor device package 5 in accordance with some embodiments of the present disclosure. The semiconductor device package 5 of FIG. 5 is similar to the semiconductor device package 1 of FIG. 1, and the differences therebetween are described below.

The semiconductor device package 5 includes supporting structures 51, 52 and 53. The supporting structure 51 is disposed on the conductive layer 10a and has a surface 511 spaced apart from the surface 101 of the substrate 10 by a distance D3.

The supporting structure 52 is disposed on the supporting structure 51 and has a surface 521 spaced apart from the surface 101 of the substrate 10 by a distance D4.

The antenna 13 and the antenna 54 are supported by the surface 521 and the surface 511, respectively. The antenna 13 and the antenna 54 can be posited at different angles with respect to the substrate 10. For example, the antenna 13 may be not parallel to the antenna 54.

Figure 6:
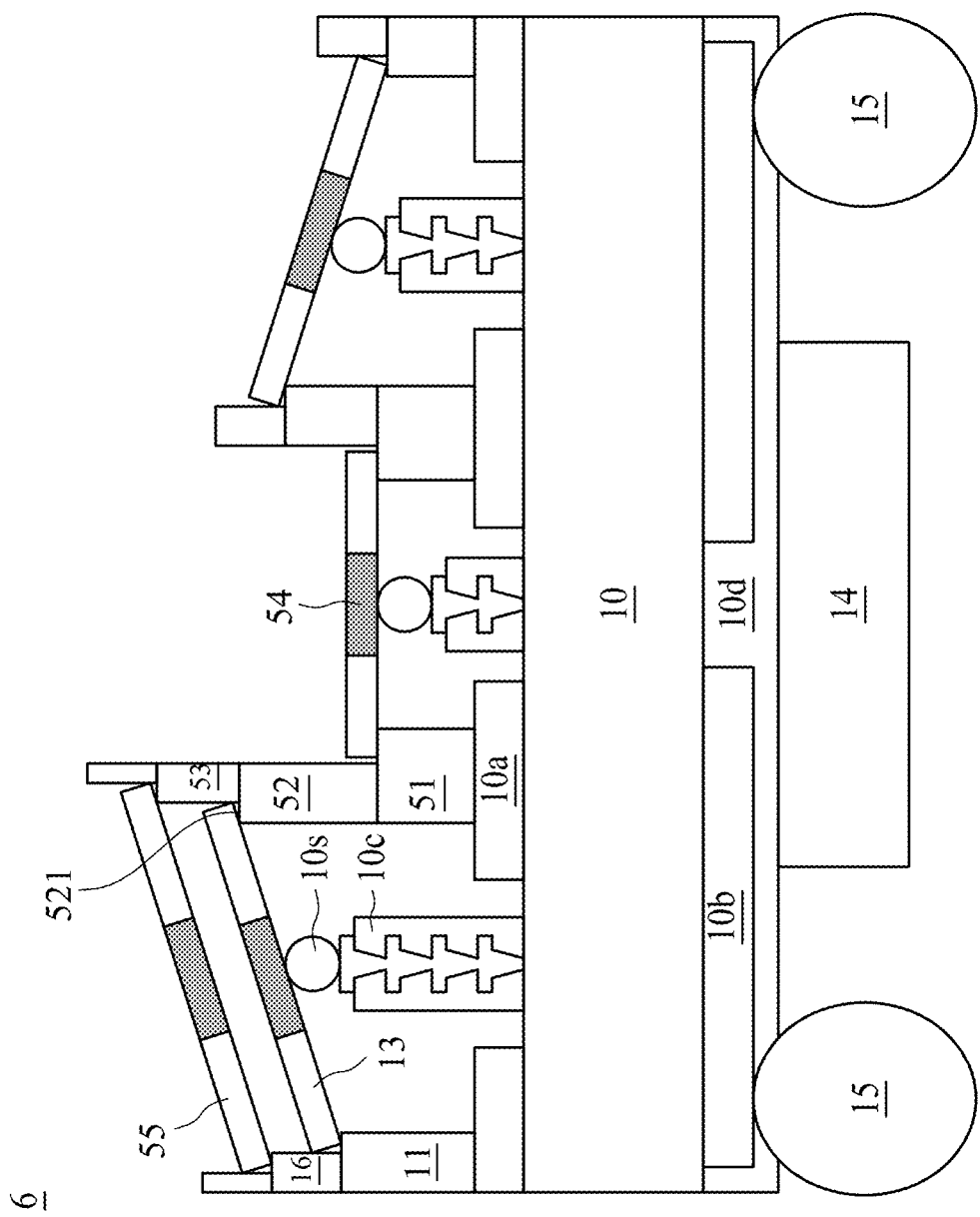
FIG. 6 illustrates a cross-sectional view of a semiconductor device package in accordance with some embodiments of the present disclosure.

FIG. 6 illustrates a cross-sectional view of a semiconductor device package 6 in accordance with some embodiments of the present disclosure. The semiconductor device package 6 of FIG. 6 is similar to the semiconductor device package 5 of FIG. 5, and the differences therebetween are described below.

The semiconductor device package 6 further includes an antenna 55 disposed above the antenna 13 and supported by the supporting structures 16 and 53. In some embodiments, the antenna 55 may be parallel to the antenna 13.

Figure 7:
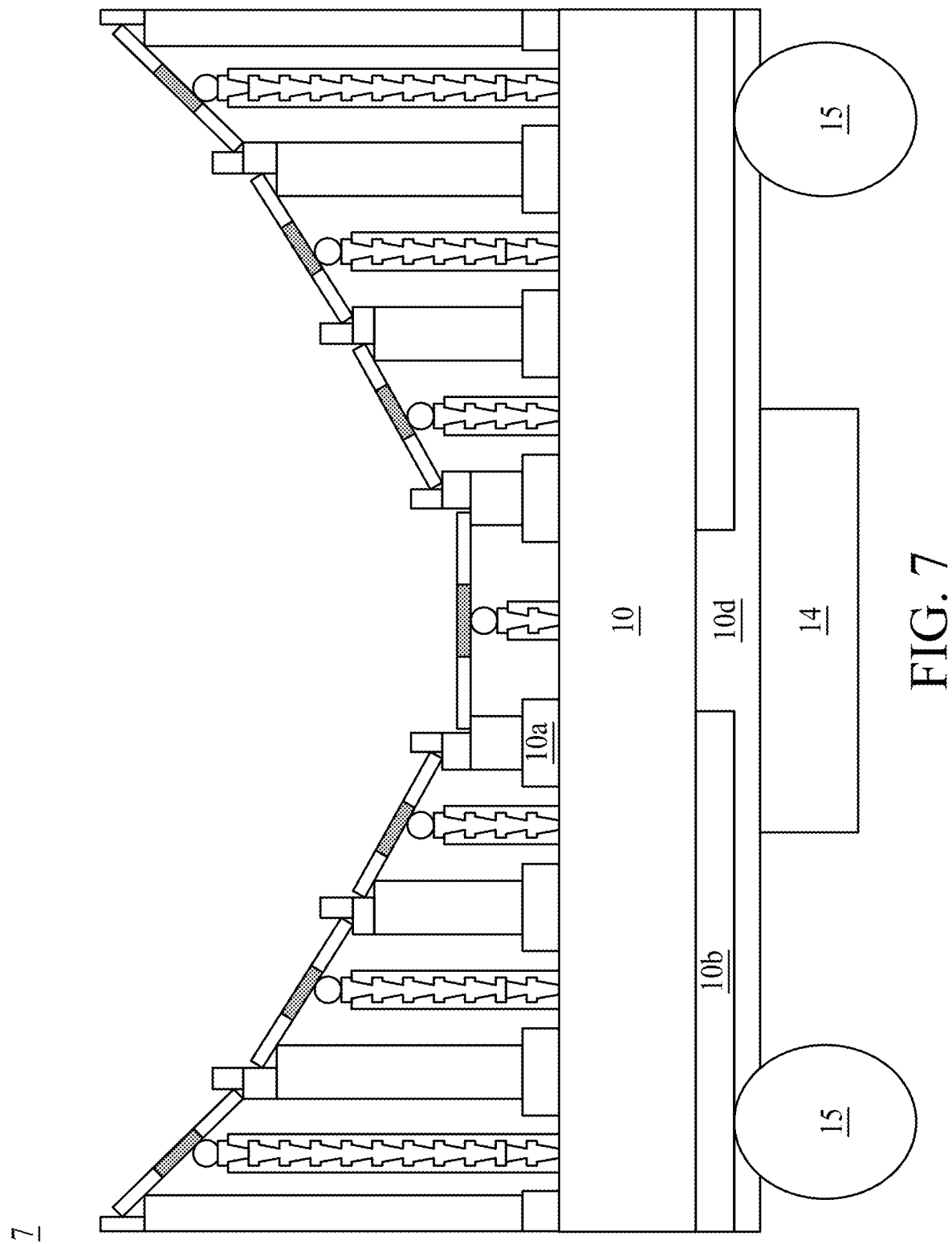
FIG. 7 illustrates a cross-sectional view of a semiconductor device package in accordance with some embodiments of the present disclosure.

FIG. 7 illustrates a cross-sectional view of a semiconductor device package 7 in accordance with some embodiments of the present disclosure. The semiconductor device package 7 of FIG. 7 is similar to the semiconductor device package 1 of FIG. 1, and the differences therebetween are described below.

The semiconductor device package 7 includes multiple antennas supported above the substrate 10 by supporting structures. Each of the antennas is posited at different angles with respect to the substrate 10. As shown in FIG. 7, the antennas are posited at different angles with respect to the substrate 10 such that the antennas form a curved or a concave array of antennas from a side view. In some embodiments, the concave array of antennas can help to concentrate RF signal and enhance radiant intensity.

Figure 8:
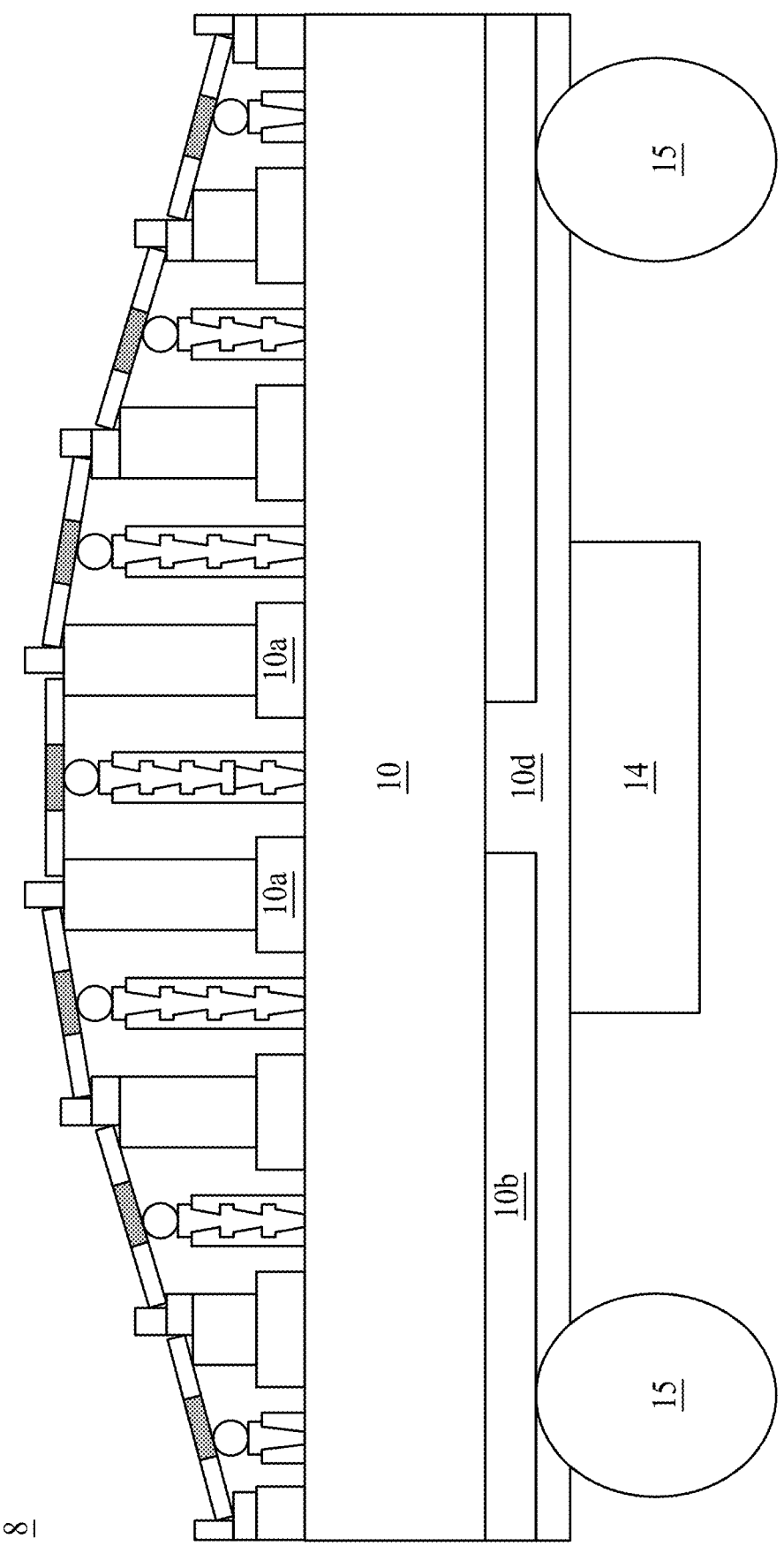
FIG. 8 illustrates a cross-sectional view of a semiconductor device package in accordance with some embodiments of the present disclosure.

FIG. 8 illustrates a cross-sectional view of a semiconductor device package 8 in accordance with some embodiments of the present disclosure. The semiconductor device package 8 of FIG. 8 is similar to the semiconductor device package 7 of FIG. 7, and the differences therebetween are described below.

The semiconductor device package 8 includes multiple antennas forming a curved or a convex array of antennas from a side view. In some embodiments, the convex array of antennas can achieve a more optimal coverage of the RF signal.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a substrate having a first surface;
a first supporting structure disposed on the first surface of the substrate and having a first surface spaced apart from the first surface of the substrate by a first distance;
a second supporting structure disposed on the first surface of the substrate and having a first surface spaced apart from the first surface of the substrate by a second distance, wherein the second distance is different from the first surface; and
a first antenna disposed above the first surface of the substrate and supported by the first surface of the first supporting structure and the first surface of the second supporting structure;
wherein a first surface of the first antenna and the first surface of the first supporting structure define an acute angle.

2. The semiconductor device package of claim 1, wherein the first antenna has a second surface facing away from the substrate and a third surface opposite the second surface; wherein the first surface of the first antenna is extending between the second surface and the third surface of the first antenna; and wherein the second surface and the third surface of the first antenna are exposed to air.

3. The semiconductor device package of claim 1, further comprising:
an adhesive layer between the first surface of the first antenna and the first supporting structure.

4. The semiconductor device package of claim 1, wherein the first supporting structure and the second supporting structure comprise solder balls.

5. The semiconductor device package of claim 1, further comprising:
a fifth supporting structure disposed between the first supporting structure and the substrate; and a sixth supporting structure disposed between the second supporting structure and the substrate, wherein a width of the fifth supporting structure is greater than a width of the first supporting structure and a width of the sixth supporting structure is greater than a width of the second supporting structure.

6. The semiconductor device package of claim 5, further comprising:

a grounding element disposed on the fifth supporting structure and the sixth supporting structure, wherein the grounding element is parallel to the first antenna.

7. The semiconductor device package of claim 6, further comprising:

a conductive via disposed within the fifth supporting structure and electrically connecting the grounding element to the substrate.

8. The semiconductor device package of claim 6, wherein the grounding element includes a hole, and the semiconductor device package further comprises a conducting element disposed on the first surface of the substrate and passing through the hole of the grounding element to be electrically connected to the first antenna.

9. The semiconductor device package of claim 6, wherein the fifth supporting structure and the first surface of the first supporting structure define a space for accommodating a part of the grounding element.

10. The semiconductor device package of claim 1, wherein a gap is defined between the first surface of the second supporting structure and the first antenna.

11. A semiconductor device package, comprising:

a substrate having a first surface;

a first supporting structure disposed on the first surface of the substrate and having a first surface spaced apart from the first surface of the substrate by a first distance;

a second supporting structure disposed on the first surface of the substrate and having a first surface spaced apart from the first surface of the substrate by a second distance, wherein the second distance is different from the first surface;

a third supporting structure disposed on the first supporting structure;

a fourth supporting structure disposed on the second supporting structure; and a first antenna disposed above the first surface of the substrate and supported by the first surface of the first supporting structure and the first surface of the second supporting structure;

wherein a width of the third supporting structure is less than a width of the first supporting structure and a width of the fourth supporting structure is less than a width of the second supporting structure.

12. The semiconductor device package of claim 11, further comprising:

a second antenna disposed on the third supporting structure and the fourth supporting structure, wherein the second antenna is parallel to the first antenna.

13. The semiconductor device package of claim 12, wherein the first antenna has a first antenna pattern and the second antenna having a second antenna pattern, and wherein the first antenna pattern of the first antenna is aligned with the second antenna pattern of the second antenna in a direction perpendicular to a surface of the first antenna.

14. The semiconductor device package of claim 11, wherein a first lateral surface of the third supporting structure and the first surface of the first supporting structure define a space for accommodating a part of the first antenna.

15. The semiconductor device package of claim 14, wherein a second lateral surface of the third supporting structure and a second surface of the first supporting structure are substantially coplanar.

16. The semiconductor device package of claim 15, wherein the second lateral surface of the third supporting structure is opposite to the first lateral surface of the third supporting structure.

17. The semiconductor device package of claim 15, wherein a surface of the substrate and the second lateral surface of the third supporting structure are substantially coplanar.

18. A semiconductor device package, comprising:

a substrate having a first surface;

a first supporting structure disposed on the first surface of the substrate and having a first surface spaced apart from the first surface of the substrate by a first distance;

a second supporting structure disposed on the first surface of the substrate and having a first surface spaced apart from the first surface of the substrate by a second distance, wherein the second distance is different from the first surface;

a seventh supporting structure disposed on the first surface of the substrate, and a first antenna disposed above the first surface of the substrate and supported by the first surface of the first supporting structure and the first surface of the second supporting structure;

wherein the first supporting structure supports a first portion of the first antenna, the second supporting structure supports a second portion of the first antenna, and the seventh supporting structure supports a third portion of the first antenna, and wherein the first portion, the second portion, and the third portion are at different levels with respect to the first surface of the substrate.

19. The semiconductor device package of claim 18, wherein the seventh supporting structure comprises a feeding element.

* * * * *